United States Patent
Madraswala et al.

(10) Patent No.: US 10,276,252 B2
(45) Date of Patent: Apr. 30, 2019

(54) DATA STORAGE DEVICE WITH OPERATION BASED ON TEMPERATURE DIFFERENCE

(71) Applicant: Intel Corporation, Santa Clara, CA (US)

(72) Inventors: Aliasgar S. Madraswala, Folsom, CA (US); Xin Guo, San Jose, CA (US); Ali Khakifirooz, Los Altos, CA (US); Pranav Kalavade, San Jose, CA (US); Sagar Upadhyay, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/838,202

(22) Filed: Dec. 11, 2017

(65) Prior Publication Data

US 2019/0043596 A1 Feb. 7, 2019

(51) Int. Cl.
*G11C 16/34* (2006.01)
*G11C 16/04* (2006.01)
*G11C 16/22* (2006.01)
*G11C 16/10* (2006.01)
*G11C 11/56* (2006.01)

(52) U.S. Cl.
CPC ...... *G11C 16/3459* (2013.01); *G11C 11/5628* (2013.01); *G11C 16/0483* (2013.01); *G11C 16/102* (2013.01); *G11C 16/22* (2013.01)

(58) Field of Classification Search
CPC ............ G11C 11/5628; G11C 16/0483; G11C 16/102; G11C 16/22

USPC .................................................... 365/185.03
See application file for complete search history.

(56) References Cited

U.S. PATENT DOCUMENTS

| 10,026,483 | B1 * | 7/2018 | Shah .................. G11C 16/16 |
| 2009/0129146 | A1 | 5/2009 | Sarin et al. |
| 2010/0329002 | A1 | 12/2010 | Dong et al. |
| 2011/0199833 | A1 | 8/2011 | Shim et al. |
| 2012/0300550 | A1 | 11/2012 | Hemink et al. |
| 2015/0046637 | A1 * | 2/2015 | Chien ...................... G11C 7/04 711/103 |
| 2015/0170746 | A1 | 6/2015 | Oowada et al. |

(Continued)

OTHER PUBLICATIONS

International Search Report and Written Opinion dated Mar. 6, 2019 for International Application No. PCT/US2018/060090, 13 pages.

*Primary Examiner* — Fernando Hidalgo
(74) *Attorney, Agent, or Firm* — Schwabe, Williamson & Wyatt, P.C.

(57) ABSTRACT

Embodiments of the present disclosure may relate to a memory controller that may include a memory interface and a logic circuitry component coupled with the memory interface. In some embodiments, the logic circuitry component is to program one or more NAND cells of a multi-level NAND memory array via the memory interface with a first set of data in a first pass, determine a first temperature of the multi-level NAND memory array in association with the first pass, determine a second temperature of the multi-level NAND memory array, determine a temperature difference between the second temperature and the first temperature, and perform one or more operations based at least in part on a result of the determination of the temperature difference. Other embodiments may be described and/or claimed.

22 Claims, 7 Drawing Sheets

(56) References Cited

U.S. PATENT DOCUMENTS

2017/0255403 A1* 9/2017 Sharon .................. G06F 3/0619
2018/0090216 A1* 3/2018 Hahn .................. G11C 11/5671

* cited by examiner

DATA STORAGE DEVICE WITH OPERATION BASED ON TEMPERATURE DIFFERENCE

FIELD

Embodiments of the present disclosure relate generally to the technical field of computing, and more particularly to NAND memory programming.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Semiconductor memory may be classified as non-volatile memory or volatile memory. A non-volatile memory, e.g., NAND flash memory, may store and retain information even when the non-volatile memory is not connected to a power source. NAND flash memory, or simply NAND memory, or a NAND memory system, may be included in a storage device to store data. Bits may be stored into cells, or memory cells, of a NAND memory, which may be made of floating-gate transistors. Multi-level NAND memory may store multiple bits of data per cell, and may include three level cells (TLC) that store three bits of data per cell, quad level cells (QLC) that store four bits of data per cell, and other types of cells such as multi-level cells (MLC) that store two bits of data per cell. TLC and QLC NAND is typically programmed with more than one pass. In a NAND device, several non-idealities may result in an increased raw bit error rate (RBER). One of these non-idealities is temperature dependence of the NAND cells (e.g., when reading cells at a temperature different than the temperature during programming the cells, the threshold voltage of the cells may appear lower or higher than the threshold voltage if the cells are read at the same temperature.) As an example, an internal pre-read of eight threshold voltage (VT) states during a third pass of a 2-8-16 technique may occur at different temperature conditions than when the states were programmed during the second pass. This may cause a high RBER and potential misplacements of sixteen VT states, which may lead to fatal errors that may be uncorrectable by an external error correcting code (ECC) engine on system platforms.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
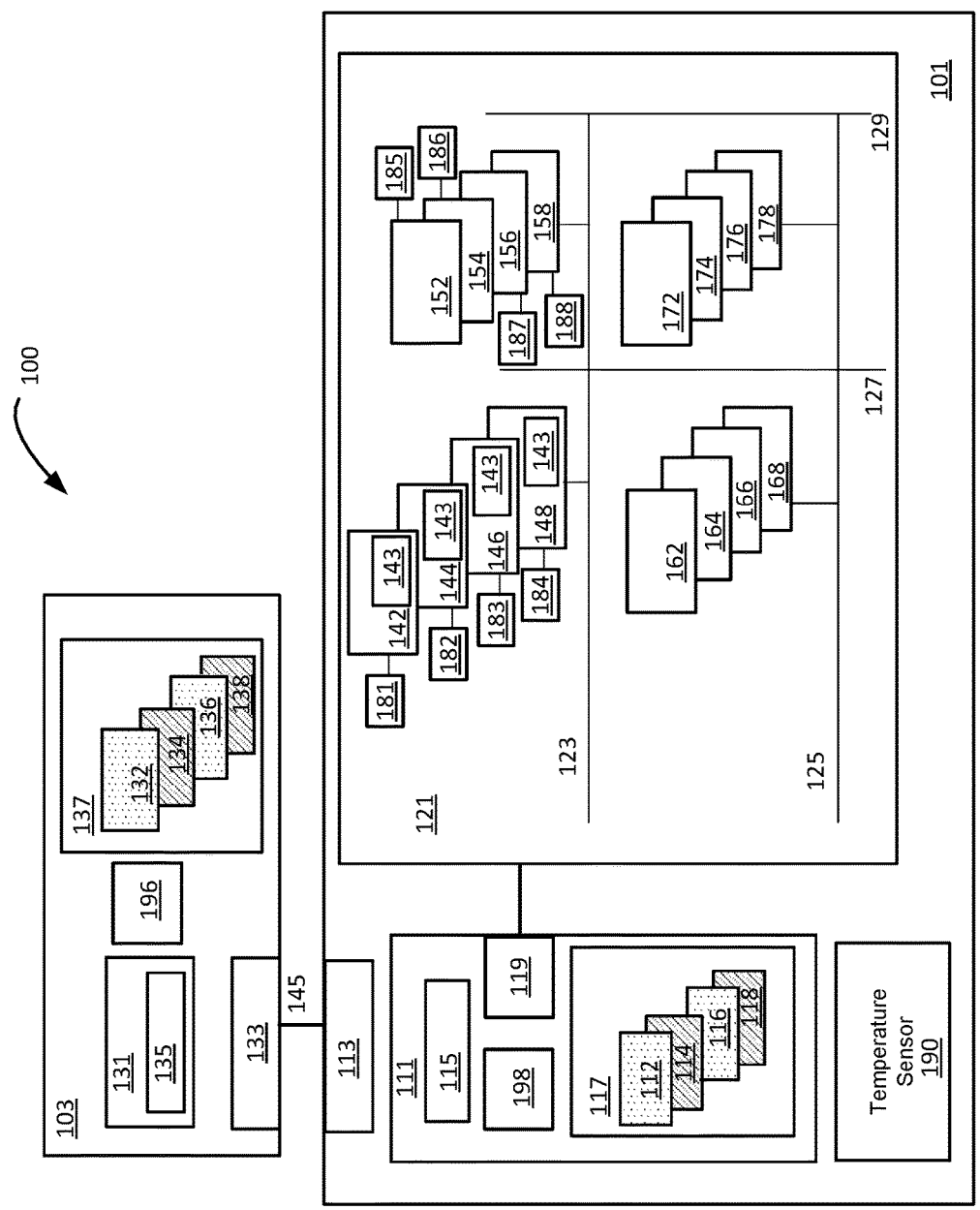
FIG. 1 illustrates an example electronic system that includes a memory controller to program a multi-level NAND memory array of a NAND memory system using temperature checks, in accordance with various embodiments.

Embodiments of the present disclosure may relate to a memory controller that may include a memory interface and a logic circuitry component coupled with the memory interface. In some embodiments, the logic circuitry component may program one or more NAND cells of a multi-level NAND memory array via the memory interface with a first set of data in a first pass, determine a first temperature of the multi-level NAND memory array in association with the first pass, determine a second temperature of the multi-level NAND memory array, and determine a temperature difference between the second temperature and the first temperature. In various embodiments, the memory controller may perform one or more operations based at least in part on a result of the determination of the temperature difference. In some embodiments, the operations may include program the one or more NAND cells with a second set of data in a second pass, in response to the temperature difference is less that a predefined threshold value. In some embodiments, the operations may include send a temperature difference exceeded flag to a host controller, facilitate an external data read of the one or more NAND cells, facilitate data correction associated with the one or more NAND cells, or facilitate recovery of data encoded by the one or more NAND cells, in response to the temperature difference is greater than the predefined threshold value.

In some embodiments, a NAND memory system may include a multi-level NAND memory array and a memory controller to control the operations, e.g., read, write (program), erase, of the multi-level NAND memory array. In various embodiments, the memory controller may program the multi-level NAND memory array based at least in part on a temperature check. A multi-level NAND memory array may include multiple cells organized into pages, blocks, planes on a die, while the multi-level NAND memory array may include multiple dies. The smallest unit of operations for a multi-level NAND memory array may be referred to as a page. A page of data may be programmed into or read from a multi-level NAND memory array.

In some embodiments, a NAND memory system may be a storage device coupled to an external computing device to store data generated by the computing device. Additionally and alternatively, a NAND memory system may be a part of a computing system to store data generated by a processor of the computing system. Sometimes, data may be programmed into the multi-level NAND memory array by the computing system or the computing device in two or more passes, to minimize the effect of coupling from the neighboring cells.

In the description to follow, reference is made to the accompanying drawings, which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A or B" and "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" or "routine" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

FIG. 1 illustrates an example electronic system 100 that includes a memory controller 111 to program multiple pages of data into a multi-level NAND memory array 121, in accordance with various embodiments. For clarity, features of the electronic system 100 may be described below in accordance with some embodiments that may include a memory controller to program multiple pages of data into a multi-level NAND memory array of a NAND memory system based at least in part on a temperature check. However, it should be understood that there may be more or fewer components included in the electronic system 100 in various embodiments. Further, it should be understood that one or more of the devices and/or components within the electronic system 100 may include additional and/or varying features from the description below.

In embodiments, the electronic system 100 may include a NAND memory system 101 coupled to a host 103 by an interconnect 145 through an interface 133 on the host 103 and an interface 113 on the NAND memory system 101. The host 103 may include a host controller 131, where the host controller 131 may generate a first page of data 132, a second page of data 134, a third page of data 136, a fourth page of data 138, and one or more program commands 135 to program the first page of data 132, the second page of data 134, the third page of data 136, and the fourth page of data 138 into the multi-level NAND memory array 121 within the NAND memory system 101. The first page of data 132, the second page of data 134, the third page of data 136, and the fourth page of data 138 may be stored in a buffer 137 in some embodiments. Although the multi-level NAND memory array 121 is shown to include quad-level cells (QLC), it should be understood that various embodiments may include other types of NAND memory, such as TLC NAND that stores three bits of data per cell, or MLC NAND that stores two bits of data per cell.

In embodiments, the NAND memory system 101 may include the multi-level NAND memory array 121, the memory controller 111, and the interface 113, coupled with each other. In various embodiments, the memory controller 111 may include a memory interface 119 coupled with the NAND memory array 121. In some embodiments, the NAND memory system 101 may include a buffer 117 that may be within the memory controller 111. In some embodiments, the memory controller 111 may receive the first page of data 132, the second page of data 134, the third page of data 136, and the fourth page of data 138, and store them as a first page of data 112, a second page of data 114, a third page of data 116, and a fourth page of data 118, respectively in the buffer 117. In various embodiments, the memory controller 111 may receive the multiple pages (e.g., pages 132, 134, 136, 138) of data in separate communications from the host 103, or may receive some or all of the multiple pages of data in a single communication from the host 103. In some embodiments, the memory controller 111 may receive the one or more program commands 135 and may store the received one or more program commands 135 as one or more program commands 115.

In some embodiments, the multi-level NAND memory array 121 may be formed by multiple cells arranged in an array. The multi-level NAND memory array 121 may include a word line 123, a word line 125, a bit line 127, and a bit line 129. In some embodiments, the bit line 127 and the bit line 129 may represent multiple bit lines. There may be multiple pages, e.g., a first page 142, a second page 144, a third page 146, and a fourth page 148 associated with the word line 123 and the bit line 127, including cells formed by the word line 123 and the bit line 127. Similarly, a page 152, a page 154, a page 156, and a page 158 may be associated with the word line 123 and the bit line 129; a page 162, a page 164, a page 166, and a page 168 may be associated with the word line 125 and the bit line 127; and a page 172, a page 174, a page 176, and a page 178 may be associated with the word line 125 and the bit line 129.

The first page 142, the second page 144, the third page 146, and the fourth page 148 may be represented by a same group of cells associated with the same word line, e.g., the word line 123. For example, a cell 143 may store multiple bits, e.g. four bits. The first bit of the cell 143 may be contained in the first page 142, the second bit of the cell 143 may be contained in the second page 144, the third bit of the cell 143 may be contained in the third page 146, and the fourth bit of the cell 143 may be contained in the fourth page 148 in various embodiments. In some embodiments, all of the cells belonging to one word line may be included in one page, so that the first page 142 may expand throughout the word line 123. In some other embodiments, cells associated with one word line may be divided into multiple pages, e.g., cells of the word line 123 may be included in the page 142 and the page 152 separately. In various embodiments, the memory controller 111 may program the first page of data 112, the second page of data 114, the third page of data 116, and the fourth page of data 118 in multiple passes into pages of the multi-level NAND memory array 121. In some embodiments, the first page 142 may be a lower page (LP), the second page 144 may be an upper page (UP), the third page 146 may be an extra page (XP), and the fourth page 148 may be a top page (TP).

In various embodiments, the NAND memory system 101 may include a temperature sensor 190. In some embodiments, the temperature sensor 190 may be or include a temperature sensor circuit. In some embodiments, the temperature sensor 190 may be on the same chip as the multi-level NAND memory array 121. In various embodiments, one or more flag bytes 181 may be associated with the first page 142, one or more flag bytes 182 may be associated with the second page 144, one or more flag bytes 183 may be associated with the third page 146, and one or more flag bytes 184 may be associated with the fourth page 148. Similarly, one or more flag bytes 185 may be associated with the page 152, one or more flag bytes 186 may be associated with the page 154, one or more flag bytes 187 may be associated with the page 156, and one or more flag bytes 158 may be associated with the page 158. In similar fashion, one or more additional flag bytes, not shown for clarity, may be associated with each of the pages 162, 164, 166, 168, 172, 174, 176, and 178.

In some embodiments, the temperature sensor 190 may sense a first temperature associated with a first programming pass, and the memory controller 111 may store the first temperature in one or more of the flag bytes. In some embodiments, the first temperature may be sensed at the same time as the first programming pass, or may be sensed within a predetermined period of time before the first programming pass or after the first programming pass. In various embodiments, the temperature sensor 190 may sense a second temperature before the memory controller 111 programs the NAND memory in a second programming pass. In some embodiments, the second temperature may be sensed at a time associated with an internal read of data programmed during the first programming pass.

In various embodiments, the memory controller 111 may determine whether a difference between the first temperature and the second temperature exceeds a predetermined maximum temperature difference. If the maximum temperature difference is not exceeded, the memory controller 111 may proceed to program the NAND memory in a second programming pass. If the maximum temperature difference is exceeded, the memory controller 111 may send a maximum temperature difference exceeded flag to the host 103. In various embodiments, the host 103 may include an ECC engine 196 that may be directed by the host controller 131 to perform error correction operations in response to receiving the maximum temperature difference exceeded flag.

In various embodiments, the memory controller 111 may include a logic circuitry component 198 coupled with the memory interface 119. In some embodiments, the logic circuitry component 198 may be to program one or more NAND cells (e.g., including cell 143) of the multi-level NAND memory array 121 via the memory interface 119 with a first set of data in a first pass. In various embodiments, the logic circuitry component 198 may be to determine a first temperature of the multi-level NAND memory array 121 in association with the first pass. In embodiments, the logic circuitry component 198 may store the first temperature in a flag byte (e.g., flag byte 181) associated with a page (e.g., first page 142). In some embodiments, the logic circuitry component 198 may be to determine a second temperature of the multi-level NAND memory array 121 and determine a temperature difference between the second temperature and the first temperature.

In various embodiments, the logic circuitry component 198 may be to perform one or more operations based at least in part on a result of the determination of the temperature difference. In some embodiments, the one or more operations may include program the one or more NAND cells with a second set of data in a second pass, in response to the temperature difference is less than or equal to a predefined threshold value. In some embodiments, the one or more operations may include one or more of send a temperature difference exceeded flag to the host controller 131, facilitate data correction associated with the one or more NAND cells, or facilitate recovery of data encoded by the one or more NAND cells, in response to the temperature difference is greater than the predefined threshold value.

In some embodiments, the logic circuitry component 198 may program the one or more NAND cells with an 8-16 technique, where the first set of data may include a first page of data, a second page of data, and a third page of data (e.g., LP, UP, and XP); and the second set of data may include a fourth page of data (e.g., TP). In embodiments, programming with an 8-16 technique may include programming each of the one or more NAND cells into one of eight levels based at least in part on the first set of data, and programming the one or more NAND cells into one of sixteen levels based at least in part on the first and second sets of data.

In some embodiments, the logic circuitry component 198 may program the one or more NAND cells with a 2-8-16 technique, where the first set of data may include a first page of data (e.g., LP), the second set of data may include a second and a third page of data (e.g., UP and XP), and the third set of data may include a fourth page of data (e.g., TP). In embodiments, programming with a 2-8-16 technique may include programming each of the one or more NAND cells into one of two levels based at least in part on the first set of data, programming each of the one or more NAND cells into one of eight levels based at least in part on the first and second sets of data, and programming each of the one or more NAND cells into one of sixteen levels based at least in part on the first, second, and third sets of data.

In various embodiments, for a 2-8-16 technique, the predefined threshold value may be a first predefined threshold value, the temperature difference may be a first temperature difference and the second temperature may be associated with the second pass. In embodiments, the logic circuitry component 198 may be to determine a third temperature of the multi-level NAND memory array, determine whether a second temperature difference between the third temperature and the second temperature is less than or equal to a second predefined threshold value, and program the one or more NAND cells with the third set of data in a third pass, in response to the second temperature difference is less than or equal to the second predefined threshold value. In embodiments, the logic circuitry component 198 may send a temperature difference exceeded flag to the host controller 131 in response to the second temperature difference is greater than the second predefined threshold value.

In some embodiments, for a three-pass technique such as a 2-8-16 technique, the first temperature check before the second pass data is programmed may compare a first temperature sensed at the time of programming data in the first pass, and a second temperature sensed when the data from the first pass is internally read. In some embodiments, if the second temperature is sensed within a predetermined time period of programming the second pass data, the second temperature may be stored in one or more flag bytes associated with one or more page addresses corresponding to the second pass data. A third temperature may be sensed when the data from the second pass is internally read, followed by a temperature check that compares the third temperature to the second temperature before programming third pass data. In some embodiments, if the second temperature is not sensed within the predetermined time period of programming the second pass data, an additional temperature may be sensed when programming the second pass data, that is then stored in one or more flag bytes for later comparison with the third temperature mentioned above, instead of comparing the second temperature to the third temperature.

In embodiments, the electronic system 100 may be a system on chip (SOC), integrating the host 103 and the NAND memory system 101, together with other components, e.g., cache, random access memory (RAM), peripheral functions, or other functions onto one chip. In some embodiments, the NAND memory system 101 may be a storage device, and the host 103 may be an external computing device coupled to the NAND memory system 101. Alternatively, the electronic system 100 may be a computing system and the host controller 131 may be a processor of the computing system, coupled to the memory controller 111 with or without the interface 113 and the interface 133, in some embodiments. The electronic system 100 may be for various applications such as wireless communication, digital signal processing, security, and other applications, in various embodiments.

In embodiments, the host 103 may be a computing system, a storage system, or any other system that may program multiple pages of data into a multi-level NAND memory array. In some examples, the host 103 may be implemented by a personal computer (e.g., a desktop computer, a laptop computer, etc.). However, the host 103 may be implemented by any other hardware and/or software. For example, the host 103 may be a smartphone, a television, a set top box, a printer, a home automation system, etc. In embodiments, the host 103 may be any type of computing system capable of programming data into the NAND memory system 101. In some embodiments, the host 103 may be a storage system, e.g., a solid-state drive (SSD) system, while the host controller 131 may be a SSD controller. When the host 103 is a SSD system, the host 103 may be coupled to another computing system, where data, e.g., the first page of data 132, the second page of data 134, the third page of data 136, and the fourth page of data 138, may be generated by another computing system or by the host 103.

In embodiments, the host 103 may include the interface 133 that communicates with the interface 113 of the NAND memory system 101 using the interconnect 145. In embodiments, the interface 113 of the NAND memory system 101 may receive the first page of data 132, the second page of data 134, the third page of data 136, and the fourth page of data 138 to be stored in the buffer 117. In embodiments, any other type of communication interconnect or link may additionally or alternatively be used for the interconnect 145, the interface 133, and/or the interface 113, such as, for example, a Parallel Advanced Technology Attachment (PATA) interconnect developed by the American National Standards Institute (ANSI) as standard no. X3.221-1994, a Serial Advanced Technology Attachment (SATA) interconnect developed by the Serial ATA International Organization, a Small Computer System Interface (SCSI) interconnect, a Serial-Attached SCSI (SAS) interconnect developed by the T10 group as standards document InterNational Committee for Information Technology Standards (INCITS), Peripheral Component Interconnect (PCI) express (PCIe) interconnect developed by the PCI Special Interests Group (PCI-SIG) as the PCI Express Base Specification, or a Non-Volatile Memory (NVMe) interconnect, etc.

In embodiments, the memory controller 111, the logic circuitry component 198, and/or the host controller 131 may be implemented by or include a hardware processor, e.g., a silicon based processor, such as a microcontroller, a 16-bit processor, a 32-bit processor, a 64-bit processor, a single core processor, a multi-core processor, a digital signal processor, an embedded processor, or any other processor. In addition, any other type of circuitry may additionally or alternatively be used such as, for example an analog or digital circuit(s), a logic circuit, a programmable processor(s), an application specific integrated circuit(s) (ASIC(s)), a programmable logic device(s) (PLD(s)) and/or field programmable logic device(s) (FPLD(s)).

In some embodiments, the buffer 117 and/or the buffer 137 may be implemented as an application specific integrated circuit (ASIC). However, any other approach to implementing a buffer may additionally or alternatively be used. For example, the buffer 117 and/or the buffer 137 may be implemented in a memory die.

Figure 2:
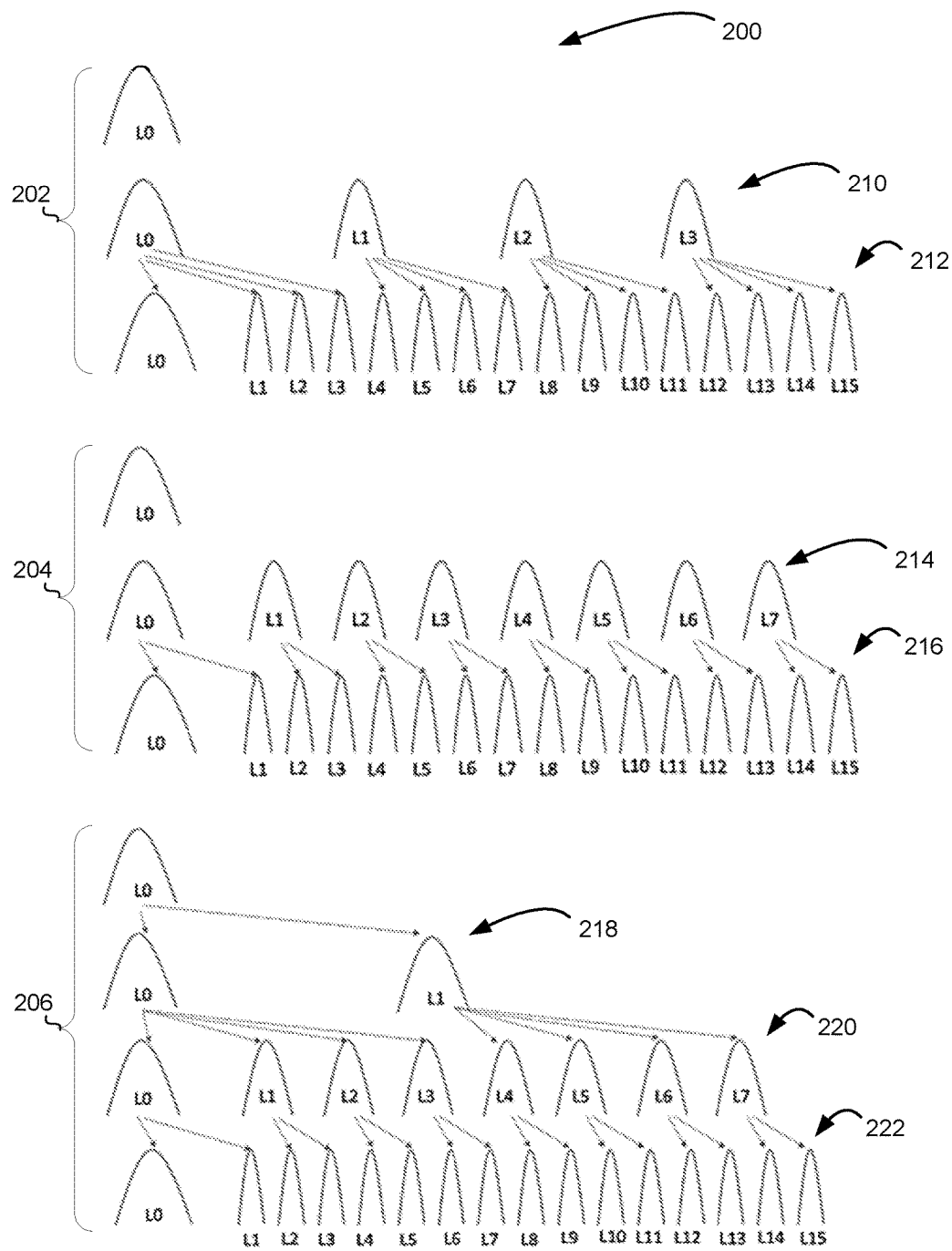
FIG. 2 is a schematic representation of threshold voltage distributions of quad-level cells for multi-pass programming techniques and associated temperature readings, in accordance with various embodiments.

FIG. 2 is a schematic representation of threshold voltage distributions 200 of QLC cells (e.g., cell 143) for multi-pass programming techniques and associated temperature readings, in accordance with various embodiments. In some embodiments, the threshold voltage distributions 200 may include a first threshold voltage distribution 202 associated with a 4-16 multi-pass programming technique, a second threshold voltage distribution 204 associated with a 8-16 multi-pass programming technique, and/or a third threshold voltage distribution 206 associated with a 2-8-16 multi-pass programming technique. In some embodiments, some or all of the multi-pass programming techniques performed with respect to the threshold voltage distributions 200 may be practiced by components shown and/or described with respect to the electronic system 100 of FIG. 1, the computing device 600 of FIG. 6, or some other component described with respect to FIG. 1 and/or FIGS. 6-7.

Programming of multi-level per cell NAND components such as MLC, TLC, or QLC may be performed in multiple passes to minimize interference from neighboring word lines (WLs). In some embodiments, programming of QLC cells may be performed in two passes according to a 4-16 programming technique, illustrated with respect to the first threshold voltage distribution 202. In a first pass 210, two pages of data may be provided, and the cells of the corresponding WL may be programmed into one of the four levels that encode two bits of information according to the two pages of data. In a second pass 212, two more pages of data may be provided, the two pages of data programmed in the first pass may be internally read, and the cells of the corresponding WL may be programmed into one of the sixteen levels that encode four bits of information.

Alternatively, programming of QLC cells may be performed in two passes according to an 8-16 programming technique, illustrated with respect to the second threshold voltage distribution 204. In a first pass 214, three pages of data may be provided, and the cells of the corresponding WL may be programmed into one of the eight levels that encode three bits of information according to the three pages of data. In a second pass 216, one more page of data may be provided, the three pages of data that were programmed in the first pass may be internally read, and the cells of the corresponding WL may be programmed into one of the sixteen levels that encode four bits of information.

In another alternative, programming of QLC cells may be performed in three passes according to a 2-8-16 technique, illustrated with respect to the third threshold voltage distribution 206. In a first pass 218, one page of data may be provided and may be used to program the cells of the corresponding WL into one of the two levels that encode one bit of information. In a second pass 220, two more pages of data may be provided, the page of data programmed in the first pass may be internally read, and the cells may be programmed into one of the eight levels that encode three bits of information. In a third pass 222, one more page of data may be provided, the three pages of data from the second pass may be internally read, and the cells may be programmed into one of the sixteen levels that encode four bits of information.

Generally, the successful placement of cells in each pass may depend on correctly reading the data programmed in the previous pass. Any error made in internally reading the data from an earlier pass may lead to programming cells into an incorrect level in a subsequent pass. The requirements set forth with respect to the allowable RBER for final placement of the cells may determine the allowable RBER for internal read operations performed on the data programmed in earlier passes. As an example according to some embodiments, if an acceptable RBER for final placement is 5e-3, the allowable RBER for internal reading of the data from an earlier pass may be 5e-4.

In normal read operations, such as an external read command issued by an SSD controller (e.g., host controller 131), the data is typically fed into an error-correcting engine (e.g., ECC engine 196) such as a low-density parity-check (LDPC) engine. In embodiments, the engine can determine whether the data is correctable. If data is correctable, the error-correcting engine corrects the data. If not, the SSD controller may re-attempt reading the data according to a series of data recovery procedures. Such data recovery procedures may include re-read, use of one or more look-up tables to adjust read levels (e.g., read voltage), reading a neighboring WL and using adjusted read levels based on the content of the neighboring WL, acquiring soft-bit read information, and any other suitable data recovery procedure. However, when data from a previous programming pass is internally read (e.g., by a memory controller) in preparation to program a subsequent pass in a multi-pass programming technique according to typical legacy approaches, there is no opportunity to correct data using an error correcting engine and use appropriate data recovery procedures if the ECC engine determines that the data is not correctable.

Various embodiments may include one or more temperature checks following one or more internal reads (e.g., by memory controller 111) of data programmed during one or more passes of a multi-pass programming technique before programming additional data in a subsequent pass of the multi-pass programming technique. In some embodiments, a temperature check may be performed before programming data in the second pass 212 by comparing temperature information recorded at the time data was programmed in the first pass 210 to a temperature sensed when the first pass data is internally read in preparation for the second pass 212. Similarly, a temperature check may be performed before programming data in the second pass 216 by comparing temperature information recorded at the time data was programmed in the first pass 214 to a temperature sensed when the first pass data is internally read in preparation for the second pass 216. In various embodiments, a three-pass programming technique may include two temperature checks, such as a first temperature check before programming data in the second pass 220, and a second temperature check before programming data in the third pass 222. If a maximum allowable temperature difference is exceeded during a temperature check, a temperature difference exceeded flag may be sent to a host controller, which may perform one or more error correction and/or data recovery procedures. In various embodiments, this may improve data integrity and/or the RBER in comparison to typical legacy approaches.

Figure 3:
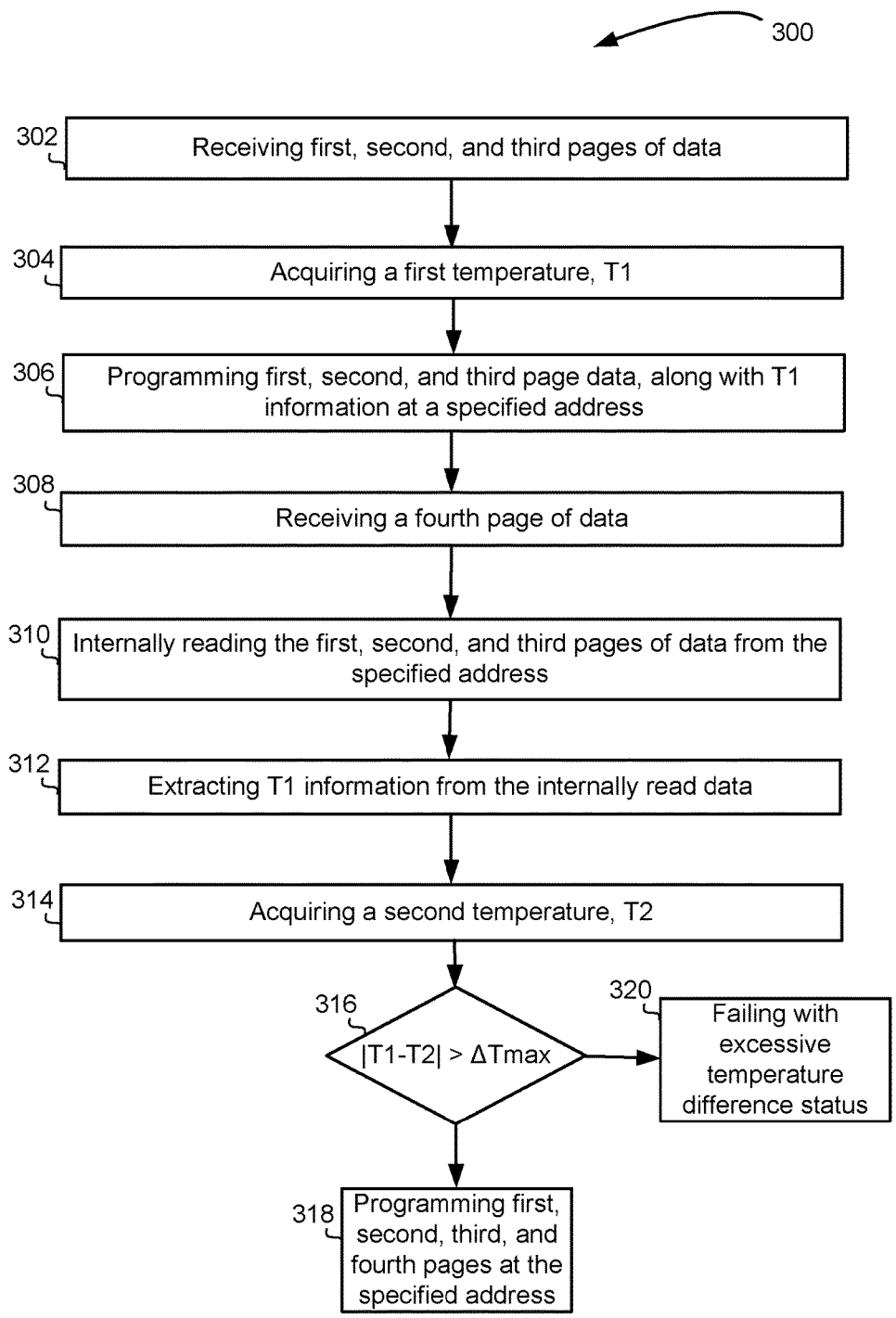
FIG. 3 illustrates a flow diagram of a technique for programming memory cells, in accordance with various embodiments.

FIG. 3 is a flow diagram of a technique 300 for programming QLC cells in a two-pass 8-16 programming technique, in accordance with various embodiments. In some embodiments, some or all of the technique 300 may be practiced by components shown and/or described with respect to the electronic system 100 of FIG. 1, the computing device 600 of FIG. 6, or some other component described with respect to FIG. 1 and/or FIGS. 6-7.

In various embodiments, at a block 302, the technique 300 may include receiving first, second, and third pages of data in a first pass. In some embodiments, the three pages may be LP, UP, and XP. In some embodiments, the first, second, and third pages of data may be received by the memory controller 111 from the host controller 131. At a block 304, the technique 300 may include acquiring a first temperature, T1.

In various embodiments, the temperature T1 may be acquired from an on-chip temperature sensor (e.g., temperature sensor 190) by the memory controller 111. At a block 306, the technique 300 may include programming first, second, and third page data, along with T1 information at a specified address. In various embodiments, the logic circuitry component 198 of the memory controller 111 may program the cells (e.g., including cell 143) of the WL that correspond to the first, second, and third page address, along with the T1 information in the first pass programming. In some embodiments, the T1 information may be programmed into a location corresponding to one or more page addresses, such as one or more flag bytes (e.g., flag bytes 181, 182, 183) associated with the programmed page addresses (e.g., page addresses for first page 142, second page 144, third page 146).

At a block 308, the technique 300 may include receiving a fourth page of data in a second pass. In embodiments, the fourth page may be a TP. At a block 310, the technique 300 may include internally reading the first, second, and third pages of data from the specified address along with the temperature information, T1, from the location used to store it during the first pass. At a block 312, the technique 300 may include extracting the T1 information from the internally read data. At a block 314, the technique 300 may include acquiring a second temperature, T2. In various embodiments, the second temperature, T2 may be associated with the internal read of the first, second, and third pages of data at the block 310, and/or may be acquired within a predetermined time of reading the first, second, and third pages of data.

At a decision block 316, the technique 300 may include determining whether a difference between T1 and T2 is greater than a predetermined maximum temperature difference, Tmax. If, it is determined that the difference between T1 and T2 is less than or equal to ΔTmax, the technique 300 may include, at a block 318, programming the first, second, third, and fourth pages at the specified address in a second pass. If, at the block 316, it is determined that the difference between T1 and T2 is greater than ΔTmax, the technique 300 may include, at a block 320, failing with an excessive temperature difference status. In some embodiments, failing with the excessive temperature difference status may include sending a temperature difference exceeded flag (e.g., from the memory controller 111 to the host controller 131). In embodiments, the temperature difference exceeded flag may be indicated with a status bit. In various embodiments, the memory controller 111 may perform a temperature check, including determining the difference between T1 and T2, automatically, without receiving a temperature check command from the host controller 131.

In various embodiments, upon receiving an excessive temperature difference flag at the block 320, the host controller 131 (e.g., an SSD controller) may perform one or more of error correction or data recovery procedures (e.g., with ECC engine 196). In various embodiments, the host controller 131 may issue a read command to externally read the data for LP, UP, and XP, and correct them through an ECC engine 196. In some embodiments, the host controller 131 may send the corrected data back to the NAND device (e.g., memory controller 111), issuing a program command that uses externally provided data for LP, UP, and XP along with TP. In embodiments, if the ECC engine 196 determines that the data is not correctable, the host controller 131 may perform other data recovery procedures such as auto read calibration, corrective read using look-up tables to adjust read parameters, soft-bit read, and/or any other suitable data recovery procedure.

Figure 4:
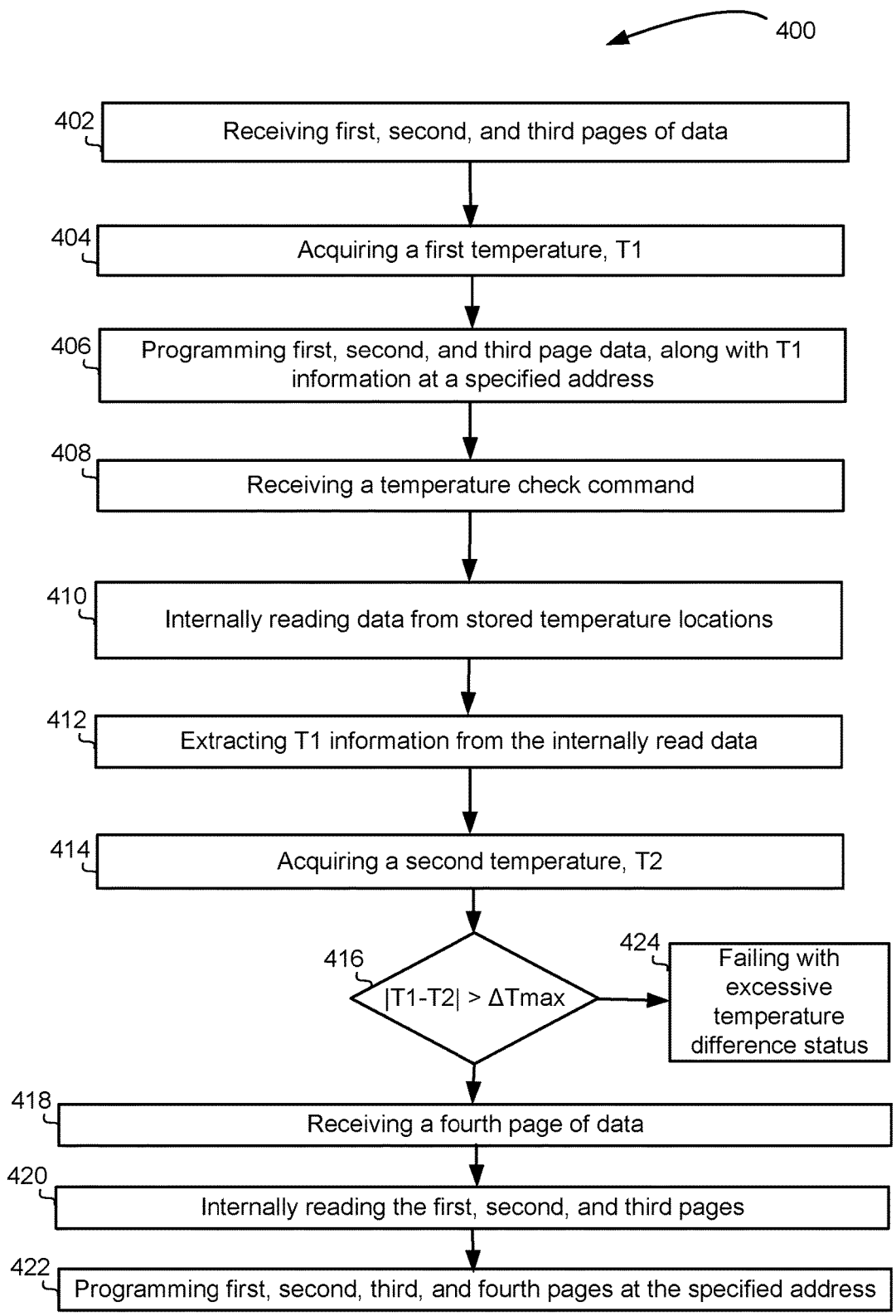
FIG. 4 illustrates a flow diagram of another technique for programming memory cells, in accordance with various embodiments.

FIG. 4 is a flow diagram of a technique 400 for programming QLC cells in a two-pass 8-16 programming technique, in accordance with other embodiments. In some embodiments, some or all of the technique 400 may be practiced by components shown and/or described with respect to the electronic system 100 of FIG. 1, the computing device 600 of FIG. 6, or some other component described with respect to FIG. 1 and/or FIGS. 6-7.

In various embodiments, at a block 402, the technique 400 may include receiving first, second, and third pages of data in a first pass. At a block 404, the technique 400 may include acquiring a first temperature, T1. In various embodiments, the temperature T1 may be acquired from an on-chip temperature sensor (e.g., temperature sensor 190) by the memory controller 111. At a block 406, the technique 400 may include programming first, second, and third page data, along with T1 information at a specified address. In various embodiments, the logic circuitry component 198 of the memory controller 111 may program the cells (e.g., including cell 143) of the WL that correspond to the first, second, and third page address, along with the T1 information in the first pass programming. In some embodiments, the T1 information may be programmed into a location corresponding to one or more page addresses, such as one or more flag bytes (e.g., flag bytes 181, 182, 183) associated with the programmed page addresses (e.g., page addresses for first page 142, second page 144, third page 146).

At a block 408, the technique 400 may include receiving a temperature check command (e.g., at the memory controller 111 from the host controller 131). In various embodiments, the host controller 131 (e.g., SSD controller) may issue the temperature check command before issuing a program command for a second pass. At a block 410, the technique 400 may include internally reading data from locations used to store first pass temperature information. At a block 412, the technique 400 may include extracting the T1 information from the internally read data. At a block 414, the technique 400 may include acquiring a second temperature, T2. At a decision block 416, the technique 400 may include determining whether a difference between T1 and T2 is greater than a predetermined maximum temperature difference, ΔTmax. If, it is determined that the difference between T1 and T2 is less than or equal to ΔTmax, the technique 400 may include, at a block 418, issuing a pass status to the host controller, and receiving a fourth page of data (e.g., TP) in response. In various embodiments, the fourth page of data may be received along with a program command from the host controller specifying that first, second, and third page data (e.g., LP, UP, and XP) are to be internally read. At a block 420, the technique 400 may include internally reading the first, second, and third pages. At a block 422, the technique 400 may include programming the first, second, and fourth pages at a specified address in a second pass.

If, at the block 416, it is determined that the difference between T1 and T2 is greater than ΔTmax, the technique 400 may include, at a block 424, failing with an excessive temperature difference status. In some embodiments, failing with the excessive temperature difference status may include sending a temperature difference exceeded flag (e.g., from the memory controller 111 to the host controller 131). In embodiments, the temperature difference exceeded flag may be indicated with a status bit.

In various embodiments, upon receiving an excessive temperature difference flag at the block 424, the host controller 131 (e.g., an SSD controller) may perform one or more of error correction or data recovery procedures. In various embodiments, the host controller 131 may issue a read command to externally read the data for LP, UP, and XP, and correct them through the ECC engine 196. In some embodiments, the host controller 131 may send the corrected data back to the NAND device (e.g., memory controller 111), issuing a program command that uses externally provided data for LP, UP, and XP along with TP. In embodiments, if the ECC engine 196 determines that the data is not correctable, the host controller 131 may perform other data recovery procedures such as auto read calibration, corrective read using look-up tables to adjust read parameters, soft-bit read, and/or any other suitable data recovery procedure.

In various embodiments, if the data is correctable or recoverable after failing with an excessive temperature difference status, the host controller 131 may issue a program command to the memory controller 111 using externally read and corrected first, second, and third page data (e.g., LP, UP, and XP) along with a fourth page (e.g., TP). The memory controller 111 may then proceed to program the first, second, third, and fourth pages at the specified address.

Although the technique 300 described with respect to FIG. 3 and the technique 400 described with respect to FIG. 4 were described using an 8-16 QLC programming, it should be understood that various embodiments may use any suitable multi-pass programming technique, including different multi-pass techniques for TLC or QLC NAND devices. In some embodiments, for a three-pass QLC programming based on a 2-8-16 technique, the memory controller 111 may determine whether there is an excessive temperature difference between a second pass (where NAND cells are programmed from 2-level to 8-level state) and a third pass (where the 8-level content of the cells is internally read and the cells are programmed from 8-level to 16-level state.) In various embodiments, the temperature may be determined by the memory controller 111 using the temperature sensor 190, and may be stored in one or more locations such as the flag bytes (e.g., one or more of flag bytes 181, 182, 183, 184, 185, 186, 187, 188) associated with one or more page addresses.

Figure 5:
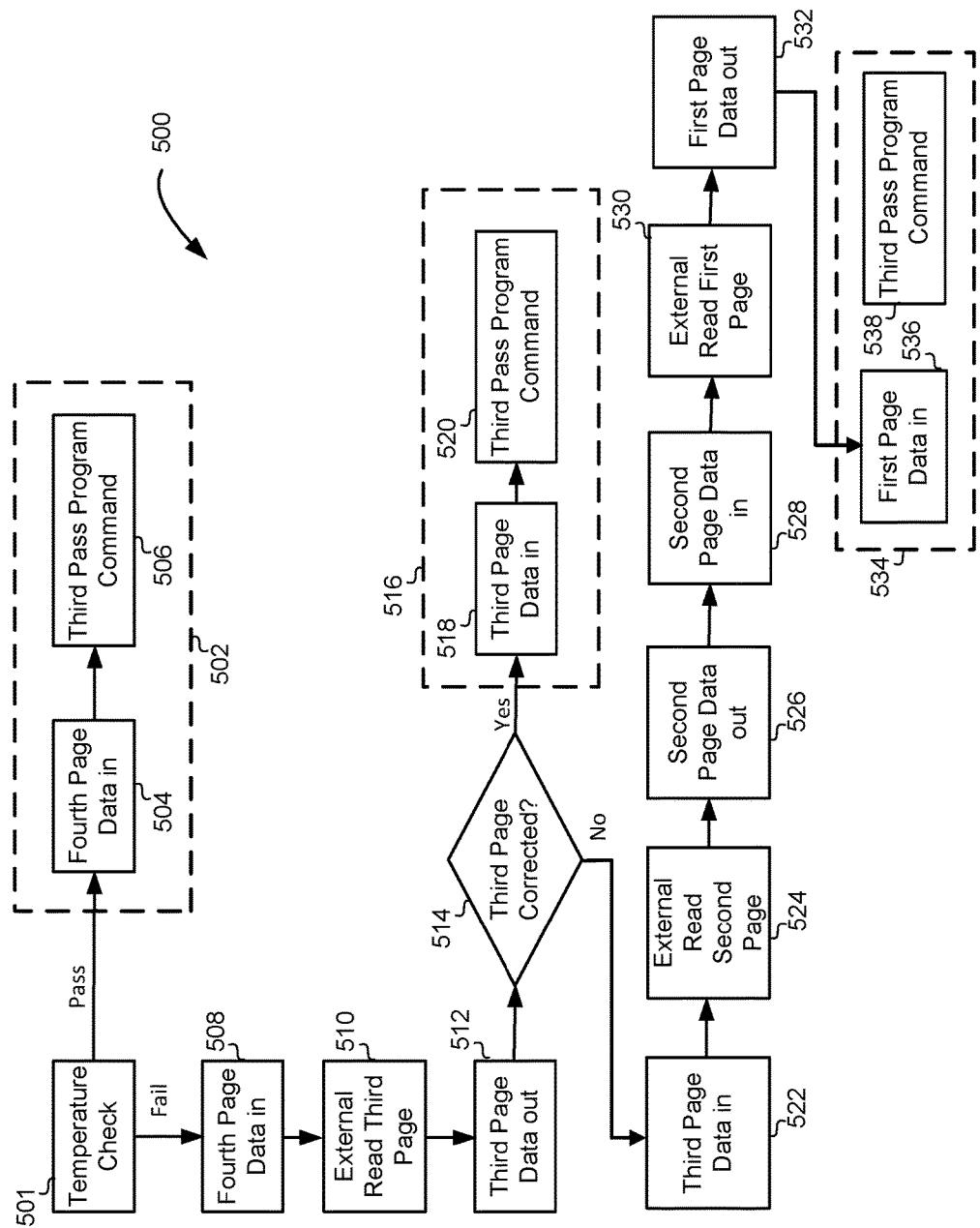
FIG. 5 illustrates a flow diagram illustrating different options to program a third pass of a 2-8-16 QLC programming technique, in accordance with various embodiments.

FIG. 5 is a flow diagram illustrating different options to program a third pass 500 of a 2-8-16 QLC programming technique, based at least in part on a temperature check status of a NAND memory device, in accordance with various embodiments. In some embodiments, some or all of the third pass 500 may be practiced by components shown and/or described with respect to the electronic system 100 of FIG. 1, the computing device 600 of FIG. 6, or some other component described with respect to FIG. 1 and/or FIGS. 6-7.

In various embodiments, the third pass 500 may include a temperature check at a block 501. In some embodiments, before the temperature check is performed at the block 501, the first two passes of the 2-8-16 QLC programming technique may have been performed, and a temperature of the NAND memory device associated with the second pass programming may have been stored (e.g., in one or more of flag bytes 181, 182, 183). At the block 501, performing the temperature check may include receiving a temperature check command at the memory controller 111 from the host controller 131. In response to the temperature check command, the memory controller 111 may acquire a current temperature (e.g., from the temperature sensor 190) and compare the current temperature to temperature information stored during the second pass of the 2-8-16 QLC programming technique (e.g., by reading the flag bytes 181, 182, 183).

If the difference between the current temperature and the temperature stored during the second pass is less than or equal to a predetermined maximum temperature difference threshold, the temperature check may be considered to have been passed, and the third pass 500 may proceed to a first option 502. In various embodiments, the first option 502 may include receiving a fourth page of data in at a block 504 along with a third pass program command 506 (e.g., from the host controller 131). In some embodiments, the memory controller 111 may program the NAND in a third pass, with internally read first, second, and third pages along with the fourth page of data received at the block 504, in response to the third pass program command received at the block 506.

If the difference between the current temperature and the temperature stored during the second pass is greater than the predetermined maximum temperature difference threshold, the temperature check may be considered to have failed, and the third pass 500 may proceed to a block 508 that may include receiving a fourth page of data in (e.g., at the memory controller 111 from the host controller 131). In various embodiments, the memory controller 111 may send an excessive temperature difference flag to the host controller 131 if the temperature check at the block 502 fails. In some embodiments, the memory controller 111 may inform the host controller 131 (e.g., SSD controller) to perform error correcting and recovery operations. In response to the excessive temperature difference flag, the host controller may perform an external read of a third page (e.g., XP) at a block 510 that may result in third page data out at a block 512.

In some embodiments, at a decision block 514, an evaluation of the error correction performed with respect to the third page may be performed to determine whether the third page results are sufficient to proceed without additional error correction. If it is determined the results are sufficient to proceed without additional error correction, the third pass 500 may proceed to a second option 516. In various embodiments, the second option may include receiving a third page of data in at a block 518 along with a third pass program command 520. In some embodiments, the memory controller 111 may program the NAND in a third pass, with internally read first and second pages along with the third page of data received at the block 518 and the fourth page of data received at the block 508, in response to the third pass program command received at the block 520.

If, at the decision block 514, it is determined that the results are not sufficient to proceed without additional error correction, the third pass 500 may proceed to additional error correction blocks. A block 522 may include receiving a corrected third page of data in. A block 524 may include performing an external read of a second page followed by a transfer of the second page data out (e.g., to host controller 131) at a block 526. After the second page data is verified, it may be transferred to the memory controller 111 at the block 528 as second page data in. In some embodiments, a block 530 may include performing an external read of a first page followed by a transfer of the first page data out (e.g., to host controller 131) at a block 532. In various embodiments, the third pass 500 may proceed to a third option 534 that may include a transfer of the first page data to the memory controller at a block 536 as first page data in, after the first page data out is verified (e.g., by ECC engine 196). The third option 534 may also include receiving a third pass program command at a block 538. In some embodiments, the memory controller 111 may program the NAND in a third pass, with error corrected first page data received at the block 536, error corrected second page data received at the block 538, error corrected third page data received at the block 522, and fourth page data received at the block 508.

In some embodiments, if the temperature check performed at the block 501 fails, first, second, and third page data may be externally read such that the check at the decision block 514 is not performed, and the third option 534 may be followed. In such embodiments, the second option 516 may not be included.

Figure 6:
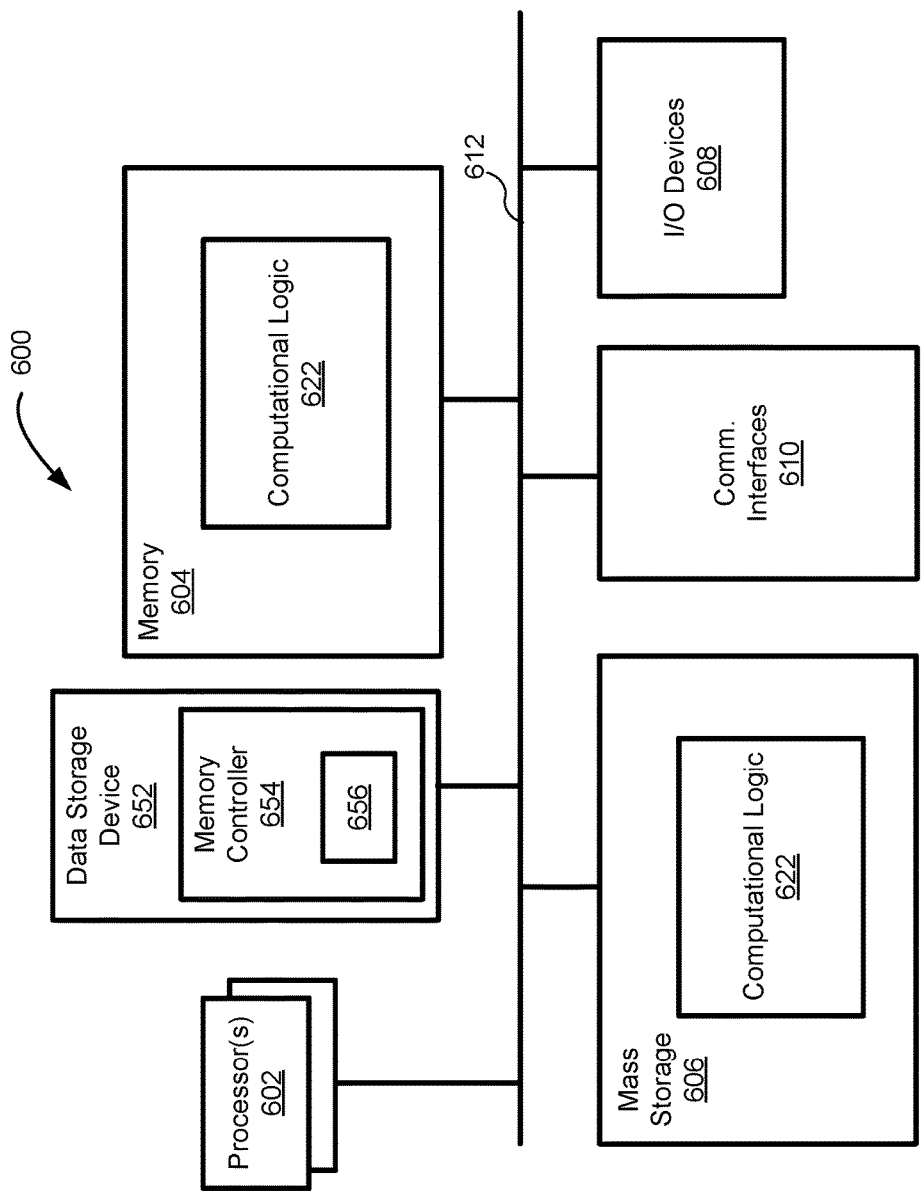
FIG. 6 is a block diagram that schematically illustrates a computing device, in accordance with various embodiments.

FIG. 6 illustrates a block diagram of an example computing device 600 suitable for use with various components of FIG. 1, the multi-pass programming techniques described with respect to FIG. 2, the technique 300 of FIG. 3, the technique 400 of FIG. 4, and/or the third pass 500 of FIG. 5, in accordance with various embodiments. For example, the computing device 600 may be, or may include or otherwise be coupled to, the electronic system 100, memory controller 111, host controller 131, and/or one or more other components shown and/or described with respect to FIG. 1. As shown, computing device 600 may include one or more processors or processor cores 602 and system memory 604. For the purpose of this application, including the claims, the terms "processor" and "processor cores" may be considered synonymous, unless the context clearly requires otherwise. The processor 602 may include any type of processors, such as a central processing unit (CPU), a microprocessor, and the like. The processor 602 may be implemented as an integrated circuit having multi-cores, e.g., a multi-core microprocessor. In some embodiments, processors 602, in addition to cores, may further include hardware accelerators, e.g., hardware accelerators implemented with Field Programmable Gate Arrays (FPGA). The computing device 600 may include mass storage devices 606 (such as diskette, hard drive, non-volatile memory (NVM) (e.g., compact disc read-only memory (CD-ROM), digital versatile disk (DVD), any other type of suitable NVM, and so forth). In general, system memory 604 and/or mass storage devices 606 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory (DRAM). Non-volatile memory may include, but is not limited to, electrically erasable programmable read-only memory, phase change memory, resistive memory, and so forth.

The computing device 600 may further include I/O devices 608 (such as a display (e.g., a touchscreen display), keyboard, cursor control, remote control, gaming controller, image capture device, and so forth) and communication interfaces 610 (such as network interface cards, modems, infrared receivers, radio receivers (e.g., Bluetooth), and so forth), one or more antennas, and/or any other suitable component.

The communication interfaces 610 may include communication chips (not shown) that may be configured to operate the device 600 in accordance with a local area network (LAN) (e.g., Ethernet) and/or a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 610 may operate in accordance with other wireless protocols in other embodiments.

In various embodiments, computing device 600 may include a data storage device 652 that may be configured in similar fashion to the electronic system 100 described with respect to FIG. 1. In some embodiments, the data storage device 652 may be coupled with other components of the computer device 600. In some embodiments, the data storage device 652 may include a memory controller 654 that may be configured in similar fashion to the memory controller 111 described with respect to FIG. 1. In some embodiments, the memory controller 654 may include a logic circuitry component 656 that may be configured in similar fashion to the logic circuitry component 198 described with respect to FIG. 1.

The above-described computing device 600 elements may be coupled to each other via system bus 612, which may represent one or more buses. In the case of multiple buses, they may be bridged by one or more bus bridges (not shown). Each of these elements may perform its conventional functions known in the art. In particular, system memory 604 and mass storage devices 606 may be employed to store a working copy and a permanent copy of the programming instructions for the operation of various components of computing device 600, including but not limited to an operating system of computing device 600, one or more applications, and/or operations associated with computing device 600 serving as memory controller 111, host controller 131, and/or logic circuitry component 198, collectively denoted as computational logic 622. The various elements may be implemented by assembler instructions supported by processor(s) 602 or high-level languages that may be compiled into such instructions. In some embodiments, the computing device 600 may be implemented as a fixed function ASIC, a FPGA, or any other suitable device with or without programmability or configuration options.

The permanent copy of the programming instructions may be placed into mass storage devices 606 in the factory, or in the field through, for example, a distribution medium (not shown), such as a compact disc (CD), or through communication interface 610 (from a distribution server (not shown)). That is, one or more distribution media having an implementation of the agent program may be employed to distribute the agent and to program various computing devices.

The number, capability, and/or capacity of the elements 608, 610, 612 may vary, depending on whether computing device 600 is used as a stationary computing device, such as a set-top box or desktop computer, or a mobile computing device, such as a tablet computing device, laptop computer, game console, or smartphone. Their constitutions are otherwise known, and accordingly will not be further described.

In some embodiments, logic circuitry component 198, the memory controller 111, and/or the host controller 131 may be included with computational logic 622 or hardware accelerators of processor 602. For some embodiments, at least one of processors 602 may be packaged together with computational logic 622 configured to practice aspects of embodiments described herein to form a System in Package (SiP) or a System on Chip (SoC).

In various implementations, the computing device 600 may comprise one or more components of a data center, a laptop, a netbook, a notebook, an ultrabook, a smartphone, a tablet, an ultra mobile PC, or a mobile phone. In some embodiments, the computing device 600 may include one or more components of a server. In further implementations, the computing device 600 may be any other electronic device that processes data.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module," or "system."

Figure 7:
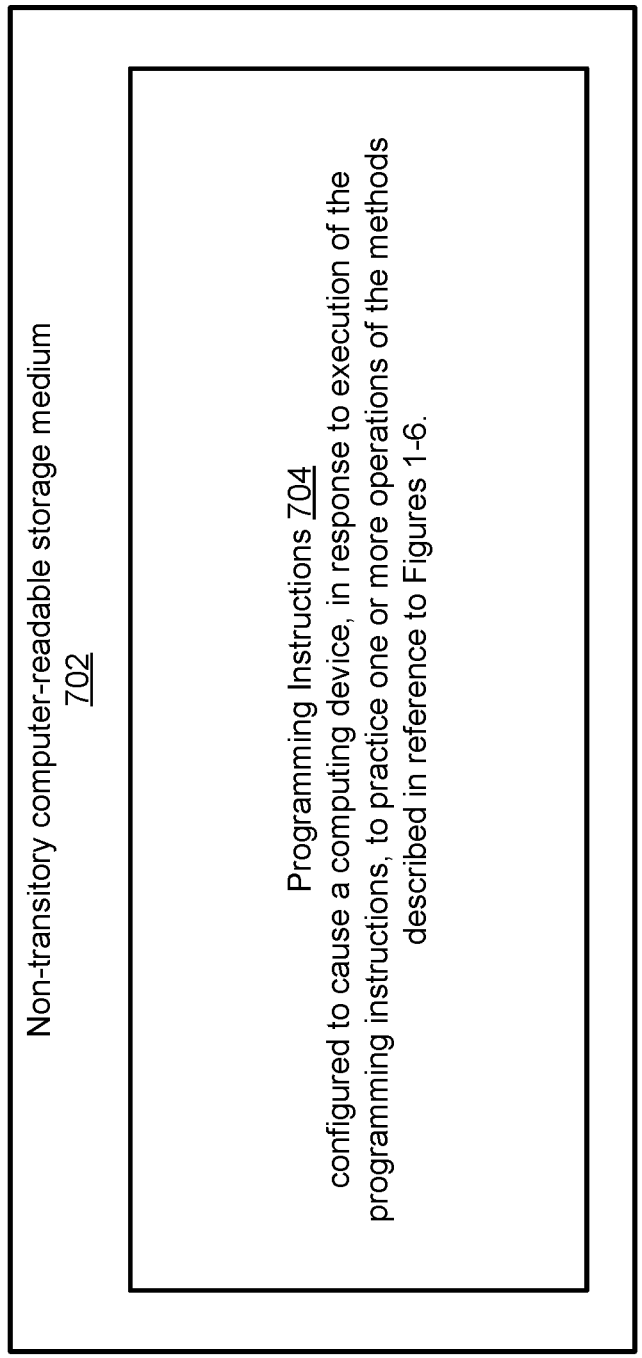
FIG. 7 illustrates an example storage medium with instructions configured to enable an apparatus to practice various aspects of the present disclosure, in accordance with various embodiments.

FIG. 7 illustrates example computer-readable storage medium 702 having instructions configured to practice all or selected ones of the operations associated with the computer device 600, earlier described with respect to FIG. 6; the electronic system 100, the memory controller 111, the logic circuitry component 198, and/or the host controller 131 described with respect to FIG. 1; the technique 300 of FIG. 3; the technique 400 of FIG. 4, and/or the third pass 500 described with respect to FIG. 5, in accordance with various embodiments. As illustrated, computer-readable storage medium 702 may include a number of programming instructions 704. The storage medium 702 may represent a broad range of non-transitory persistent storage medium known in the art, including but not limited to flash memory, dynamic random access memory, static random access memory, an optical disk, a magnetic disk, etc. Programming instructions 704 may be configured to enable a device, e.g., memory controller 111, host controller 131 and/or other components of the electronic system 100, in response to execution of the programming instructions 704, to perform, e.g., but not limited to, various operations described for the memory controller 111, the logic circuitry component 198, the host controller 131, the computer device 600 of FIG. 6, operations shown and/or described with respect to technique 300 of FIG. 3, the technique 400 of FIG. 4, and/or the third pass 500 of FIG. 5. In alternate embodiments, programming instructions 704 may be disposed on multiple computer-readable storage media 702. In an alternate embodiment, storage medium 702 may be transitory, e.g., signals encoded with programming instructions 704.

Referring back to FIG. 6, for an embodiment, at least one of processors 602 may be packaged together with memory having all or portions of computational logic 622 configured to practice aspects shown or described for the memory controller 111, the logic circuitry component 198, the host controller 131, the computer device 600 of FIG. 6, operations shown and/or described with respect to technique 300 of FIG. 3, the technique 400 of FIG. 4, and/or the third pass 500 of FIG. 5. For an embodiment, at least one of processors 602 may be packaged together with memory having all or portions of computational logic 622 configured to practice aspects described for the memory controller 111, the logic circuitry component 198, the host controller 131, the computer device 600 of FIG. 6, operations shown and/or described with respect to technique 300 of FIG. 3, the technique 400 of FIG. 4, and/or the third pass 500 of FIG. 5 to form a System in Package (SiP). For an embodiment, at least one of processors 602 may be integrated on the same die with memory having all or portions of computational logic 622 configured to practice aspects described for the memory controller 111, the logic circuitry component 198, the host controller 131, the computer device 600 of FIG. 6, operations shown and/or described with respect to technique 300 of FIG. 3, the technique 400 of FIG. 4, and/or the third pass 500 of FIG. 5. For an embodiment, at least one of processors 602 may be packaged together with memory having all or portions of computational logic 622 configured to practice aspects of the memory controller 111, the logic circuitry component 198, the host controller 131, the computer device 600 of FIG. 6, operations shown and/or described with respect to technique 300 of FIG. 3, the technique 400 of FIG. 4, and/or the third pass 500 of FIG. 5 to form a System on Chip (SoC).

Machine-readable media (including non-transitory machine-readable media, such as machine-readable storage media), methods, systems and devices for performing the above-described techniques are illustrative examples of embodiments disclosed herein. Additionally, other devices in the above-described interactions may be configured to perform various disclosed techniques.

EXAMPLES

Example 1 may include a memory controller comprising: a memory interface; and a logic circuitry component coupled with the memory interface, wherein the logic circuitry component is to: program one or more NAND cells of a multi-level NAND memory array via the memory interface with a first set of data in a first pass; determine a first temperature of the multi-level NAND memory array in association with the first pass; determine a second temperature of the multi-level NAND memory array; determine a temperature difference between the second temperature and the first temperature; and perform one or more operations based at least in part on a result of the determination of the temperature difference.

Example 2 may include the subject matter of Example 1, wherein the one or more operations include one or more of: program the one or more NAND cells with a second set of data in a second pass, in response to the temperature difference is less than or equal to a predefined threshold value; and send a temperature difference exceeded flag to a host controller, facilitate an external data read of the one or more NAND cells, facilitate data correction associated with the one or more NAND cells, or facilitate recovery of data encoded by the one or more NAND cells, in response to the temperature difference is greater than the predefined threshold value.

Example 3 may include the subject matter of any one of Examples 1-2, wherein the logic circuitry component is to store the first temperature in a flag byte associated with a page address.

Example 4 may include the subject matter of any one of Examples 1-3, wherein the logic circuitry component is to program the one or more NAND cells with a second set of data in a second pass, in response to the temperature difference is less than or equal to the predefined threshold value.

Example 5 may include the subject matter of Example 4, wherein: the one or more NAND cells are quad-level cells; the first set of data includes a first page of data and a second page of data; the second set of data includes a third page of data and a fourth page of data; the first pass includes programming each of the one or more NAND cells into one of four levels based at least in part on the first set of data; and the second pass includes programming each of the one or more NAND cells into one of sixteen levels based at least in part on the first and second sets of data.

Example 6 may include the subject matter of Example 4, wherein: the one or more NAND cells are quad-level cells; the first set of data include a first page of data, a second page of data, and a third page of data; the second set of data includes a fourth page of data; the first pass includes programming each of the one or more NAND cells into one of eight levels based at least in part on the first set of data; and the second pass includes programming the one or more NAND cells into one of sixteen levels based at least in part on the first and second sets of data.

Example 7 may include the subject matter of Example 4, wherein the predefined threshold value is a first predefined threshold value, the temperature difference is a first temperature difference, the second temperature is associated with the second pass, and the logic circuitry component is also to: determine a third temperature of the multi-level NAND memory array; determine whether a second temperature difference between the third temperature and the second temperature is less than or equal to a second predefined threshold value; and program the one or more NAND cells with a third set of data in a third pass, in response to the second temperature difference is less than or equal to the second predefined threshold value.

Example 8 may include the subject matter of Example 7, wherein: the one or more NAND cells are quad-level cells; the first set of data includes a first page of data; the second set of data includes a second and a third page of data; the third set of data includes a fourth page of data; the first pass includes programming each of the one or more NAND cells into one of two levels based at least in part on the first set of data; the second pass includes programming each of the one or more NAND cells into one of eight levels based at least in part on the first and second sets of data; and the third pass includes programming each of the one or more NAND cells into one of sixteen levels based at least in part on the first, second, and third sets of data.

Example 9 may include the subject matter of any one of Examples 1-3, wherein the logic circuitry component is to send a temperature difference exceeded flag to a host controller in response to the temperature difference is greater than the predefined threshold value.

Example 10 may include the subject matter of any one of Examples 1-9, wherein the logic circuitry component is to determine the second temperature and determine whether the temperature difference between the second temperature and the first temperature is less than or equal to the predefined threshold in response to a temperature check command received from a host.

Example 11 may include the subject matter of any one of Examples 1-10, wherein the logic circuitry component includes a processor.

Example 12 may include a data storage apparatus comprising: a multi-level NAND memory array including one or more NAND cells associated with a word line; a memory controller coupled with the multi-level NAND array, wherein the memory controller is to: program the one or more NAND cells with a first set of data in a first pass; determine a first temperature of the multi-level NAND memory array in association with the first pass; determine a second temperature of the multi-level NAND memory array; determine whether a temperature difference between the second temperature and the first temperature is less than or equal to a predefined threshold value; and program the one or more NAND cells with a second set of data in a second pass, in response to the temperature difference is less than or equal to the predefined threshold value.

Example 13 may include the subject matter of Example 12, further including a temperature sensor, wherein the memory controller is to determine the first and second temperatures based at least in part on temperatures sensed by the temperature sensor.

Example 14 may include the subject matter of any one of Examples 12-13, wherein the memory controller is further to store the first temperature in a flag byte associated with a page address.

Example 15 may include the subject matter of any one of Examples 12-14, wherein: the one or more NAND cells are quad-level cells; the first set of data includes a first page of data and a second page of data; the second set of data includes a third page of data and a fourth page of data; the first pass includes programming the each of the one or more NAND cells into one of four levels based at least in part on the first set of data; and the second pass includes programming each of the one or more NAND cells into one of sixteen levels based at least in part on the first and second sets of data.

Example 16 may include the subject matter of any one of Examples 12-14, wherein the predefined threshold value is a first predefined threshold value, the temperature difference is a first temperature difference, the second temperature is associated with the second pass, and the logic circuitry component is also to: determine a third temperature of the multi-level NAND memory array; determine whether a second temperature difference between the third temperature and the second temperature is less than or equal to a second predefined threshold value; and perform one or more operations based at least in part on a result of a determination of the second temperature difference.

Example 17 may include the subject matter of any one of Examples 12-16, further including a host controller communicatively coupled with the memory controller, wherein the host controller is to send the first set of data to the memory controller.

Example 18 may include the subject matter of Example 17, wherein the memory controller is to send a temperature difference exceeded flag to the host controller in response to the temperature difference is greater than the predefined threshold value.

Example 19 may include the subject matter of Example 18, wherein the host controller is to perform an external data read to error correct the first set of data in response to the temperature difference exceeded flag.

Example 20 may include the subject matter of any one of Examples 17-19, wherein: the host controller is to send a temperature check command to the memory controller; and the memory controller is to determine whether the temperature difference between the second temperature and the first temperature is less than or equal to the predefined threshold in response to the temperature check command.

Example 21 may include the subject matter of any one of Examples 17-20, wherein the apparatus is a solid-state drive (SSD) and the host controller is a SSD controller.

Example 22 may include a method comprising: receiving a first set of data from a host controller; programming, with a memory controller, one or more NAND cells associated with a word line of a multi-level NAND memory array with the first set of data in a first pass; determining, by the memory controller, a first temperature of the multi-level NAND memory array in association with the first pass; determining, by the memory controller, a second temperature of the multi-level NAND memory array; determining, by the memory controller, whether a temperature difference between the second temperature and the first temperature is less than or equal to a predefined threshold value; and performing one of, by the memory controller: programming the one or more NAND cells with a second set of data in a second pass, in response to the temperature difference is less than or equal to the predefined threshold value; or sending a temperature difference exceeded flag to the host controller, in response to the temperature difference is greater than the predefined threshold value.

Example 23 may include the subject matter of Example 22, wherein the method includes storing the first temperature in a flag byte associated with a page address, and wherein determining whether the temperature difference between the second temperature and the first temperature is less than or equal to the predefined threshold value includes reading the flag byte associated with the page address to obtain the stored first temperature.

Example 24 may include the subject matter of Example 22, wherein the multi-level NAND memory array is a triple level cell (TLC) array, a quad level cell (QLC) array, or a multi-level cell (MLC) array.

Example 25 may include the subject matter of Example 22, wherein the host controller is a solid-state drive (SSD) controller.

Example 26 may include an apparatus comprising: means for receiving a first set of data from a host controller; means for programming one or more NAND cells associated with a word line of a multi-level NAND memory array with the first set of data in a first pass; means for determining a first temperature of the multi-level NAND memory array in association with the first pass; means for determining a second temperature of the multi-level NAND memory array; means for determining whether a temperature difference between the second temperature and the first temperature is less than or equal to a predefined threshold value; and means for performing one of programming the one or more NAND cells with a second set of data in a second pass, in response to the temperature difference is less than or equal to the predefined threshold value; or sending a temperature difference exceeded flag to the host controller, in response to the temperature difference is greater than the predefined threshold value.

Example 27 may include the subject matter of Example 26, wherein the apparatus includes means for storing the first temperature in a flag byte associated with a page address, wherein the means for determining whether the temperature difference between the second temperature and the first temperature is less than or equal to the predefined threshold value includes means for reading the flag byte associated with the page address to obtain the stored first temperature.

Example 28 may include the subject matter of any one of Examples 26-27, wherein the multi-level NAND memory array is a triple level cell (TLC) array or a quad level cell (QLC) array.

Example 29 may include one or more non-transitory machine-readable media comprising instructions that cause a memory controller, in response to execution of the instructions by the memory controller, to: program one or more NAND cells of a multi-level NAND memory array with a first set of data in a first pass; determine a first temperature of the multi-level NAND memory array in association with the first pass; determine a second temperature of the multi-level NAND memory array associated with an internal read of the first set of data; determine a temperature difference between the second temperature and the first temperature; and perform one or more operations based at least in part on a result of the determination of the temperature difference.

Example 30 may include the subject matter of Example 29, wherein the one or more operations include one or more of: program the one or more NAND cells with a second set of data in a second pass, in response to the temperature difference is less than or equal to a predefined threshold value; and send a temperature difference exceeded flag to a host controller, facilitate an external data read of the one or more NAND cells, facilitate data correction associated with the one or more NAND cells, or facilitate recovery of data encoded by the one or more NAND cells, in response to the temperature difference is greater than the predefined threshold value.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions stored thereon that, when executed, result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A memory controller comprising:
 a memory interface; and
 a logic circuitry component coupled with the memory interface, wherein the logic circuitry component is to:
  program one or more NAND cells of a multi-level NAND memory array via the memory interface with a first set of data in a first pass;
  determine a first temperature of the multi-level NAND memory array in association with the first pass;
  determine a second temperature of the multi-level NAND memory array;
  determine a temperature difference between the second temperature and the first temperature; and
  perform one or more operations based at least in part on a result of the determination of the temperature difference, wherein the one or more operations include one or more of: program the one or more NAND cells with a second set of data in a second pass, in response to the temperature difference being less than or equal to a predefined threshold value; and send a flag indicating that the temperature difference exceeded the predefined threshold value to a host controller, to facilitate an external data read of the one or more NAND cells, data correction associated with the one or more NAND cells, or recovery of data encoded by the one or more NAND cells, in response to the temperature difference being greater than the predefined threshold value.

2. The memory controller of claim 1, wherein the logic circuitry component is to store the first temperature in a flag byte associated with a page address.

3. The memory controller of claim 1, wherein the logic circuitry component is to program the one or more NAND cells with a second set of data in a second pass, in response to the temperature difference is less than or equal to the predefined threshold value.

4. The memory controller of claim 3, wherein:
the one or more NAND cells are quad-level cells;
the first set of data includes a first page of data and a second page of data;
the second set of data includes a third page of data and a fourth page of data;
the first pass includes programming each of the one or more NAND cells into one of four levels based at least in part on the first set of data; and
the second pass includes programming each of the one or more NAND cells into one of sixteen levels based at least in part on the first and second sets of data.

5. The memory controller of claim 3, wherein:
the one or more NAND cells are quad-level cells;
the first set of data include a first page of data, a second page of data, and a third page of data;
the second set of data includes a fourth page of data;
the first pass includes programming each of the one or more NAND cells into one of eight levels based at least in part on the first set of data; and
the second pass includes programming the one or more NAND cells into one of sixteen levels based at least in part on the first and second sets of data.

6. The memory controller of claim 3, wherein the predefined threshold value is a first predefined threshold value, the temperature difference is a first temperature difference, the second temperature is associated with the second pass, and the logic circuitry component is also to:
determine a third temperature of the multi-level NAND memory array;
determine whether a second temperature difference between the third temperature and the second temperature is less than or equal to a second predefined threshold value; and
program the one or more NAND cells with a third set of data in a third pass, in response to the second temperature difference is less than or equal to the second predefined threshold value.

7. The memory controller of claim 6, wherein:
the one or more NAND cells are quad-level cells;
the first set of data includes a first page of data;
the second set of data includes a second and a third page of data;
the third set of data includes a fourth page of data;
the first pass includes programming each of the one or more NAND cells into one of two levels based at least in part on the first set of data;
the second pass includes programming each of the one or more NAND cells into one of eight levels based at least in part on the first and second sets of data; and
the third pass includes programming each of the one or more NAND cells into one of sixteen levels based at least in part on the first, second, and third sets of data.

8. The memory controller of claim 1, wherein the logic circuitry component is to send a temperature difference exceeded flag to a host controller in response to the temperature difference is greater than the predefined threshold value.

9. The memory controller of claim 1, wherein the logic circuitry component is to determine the second temperature and determine whether the temperature difference between the second temperature and the first temperature is less than or equal to the predefined threshold value in response to a temperature check command received from a host.

10. The memory controller of claim 1, wherein the logic circuitry component includes a processor.

11. A data storage apparatus comprising:
a multi-level NAND memory array including one or more NAND cells associated with a word line, wherein the one or more NAND cells are quad-level cells;
a memory controller coupled with the multi-level NAND memory array, wherein the memory controller is to:
program the one or more NAND cells with a first set of data in a first pass, wherein the first set of data includes a first page of data and a second page of data, and the first pass includes programming the each of the one or more NAND cells into one of four levels based at least in part on the first set of data;
determine a first temperature of the multi-level NAND memory array in association with the first pass;
determine a second temperature of the multi-level NAND memory array;
determine whether a temperature difference between the second temperature and the first temperature is less than or equal to a predefined threshold value; and
program the one or more NAND cells with a second set of data in a second pass, in response to the temperature difference is less than or equal to the predefined threshold value, wherein the second set of data includes a third page of data and a fourth page of data, and the second pass includes programming each of the one or more NAND cells into one of sixteen levels based at least in part on the first and second sets of data.

12. The apparatus of claim 11, further including a temperature sensor, wherein the memory controller is to determine the first and second temperatures based at least in part on temperatures sensed by the temperature sensor.

13. The apparatus of claim 11, wherein the memory controller is further to store the first temperature in a flag byte associated with a page address.

14. The apparatus of claim 11, wherein the predefined threshold value is a first predefined threshold value, the temperature difference is a first temperature difference, the second temperature is associated with the second pass, and a logic circuitry component is also to:
determine a third temperature of the multi-level NAND memory array;
determine whether a second temperature difference between the third temperature and the second temperature is less than or equal to a second predefined threshold value; and
perform one or more operations based at least in part on a result of a determination of the second temperature difference.

15. The apparatus of claim 11, further including a host controller communicatively coupled with the memory controller, wherein the host controller is to send the first set of data to the memory controller.

16. The apparatus of claim 15, wherein the memory controller is to send a temperature difference exceeded flag to the host controller in response to the temperature difference is greater than the predefined threshold value.

17. The apparatus of claim 16, wherein the host controller is to perform an external data read to error correct the first set of data in response to the temperature difference exceeded flag.

18. The apparatus of claim 15, wherein:
the host controller is to send a temperature check command to the memory controller; and
the memory controller is to determine whether the temperature difference between the second temperature and the first temperature is less than or equal to the predefined threshold value in response to the temperature check command.

19. The apparatus of claim 15, wherein the apparatus is a solid-state drive (SSD) and the host controller is an SSD controller.

20. A method comprising:
receiving a first set of data from a host controller;
programming, with a memory controller, one or more NAND cells associated with a word line of a multi-level NAND memory array with the first set of data in a first pass;
determining, by the memory controller, a first temperature of the multi-level NAND memory array in association with the first pass;
storing, by the memory controller, the first temperature in a flag byte associated with a page address;
determining, by the memory controller, a second temperature of the multi-level NAND memory array;
determining, by the memory controller, whether a temperature difference between the second temperature and the first temperature is less than or equal to a predefined threshold value, including reading the flag byte associated with the page address to obtain the stored first temperature; and
performing one of, by the memory controller:
programming the one or more NAND cells with a second set of data in a second pass, in response to the temperature difference being less than or equal to the predefined threshold value; or
sending a temperature difference exceeded flag to the host controller, in response to the temperature difference being greater than the predefined threshold value.

21. The method of claim 20, wherein the multi-level NAND memory array is a triple level cell (TLC) array, a quad level cell (QLC) array, or a multi-level cell (MLC) array.

22. The method of claim 20, wherein the host controller is a solid-state drive (SSD) controller.

* * * * *